United States Patent
Wang et al.

(10) Patent No.: US 10,680,016 B2
(45) Date of Patent: Jun. 9, 2020

(54) FLEXIBLE DISPLAY PANEL, METHOD FOR FABRICATING THE SAME, AND FLEXIBLE DISPLAY DEVICE

(71) Applicant: BOE Technology Group Co., Ltd., Beijing (CN)

(72) Inventors: Tao Wang, Beijing (CN); Weifeng Zhou, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 102 days.

(21) Appl. No.: 16/079,792

(22) PCT Filed: Jan. 25, 2018

(86) PCT No.: PCT/CN2018/074145
§ 371 (c)(1),
(2) Date: Aug. 24, 2018

(87) PCT Pub. No.: WO2018/201760
PCT Pub. Date: Nov. 8, 2018

(65) Prior Publication Data
US 2019/0311657 A1    Oct. 10, 2019

(30) Foreign Application Priority Data

May 2, 2017    (CN) .......................... 2017 1 0301304

(51) Int. Cl.
*G06F 9/30* (2018.01)
*G06F 1/16* (2006.01)
(Continued)

(52) U.S. Cl.
CPC ........ *H01L 27/1214* (2013.01); *G06F 1/1652* (2013.01); *G09F 9/301* (2013.01); *H01L 27/1259* (2013.01)

(58) Field of Classification Search
CPC . G06F 1/1652; G06F 1/1682; H01L 27/1214; H01L 27/1259
See application file for complete search history.

(56) References Cited

U.S. PATENT DOCUMENTS

2014/0029212 A1    1/2014  Hwang et al.
2014/0306941 A1   10/2014  Kim et al.
(Continued)

FOREIGN PATENT DOCUMENTS

| CN | 103578356 A | 2/2014 |
| CN | 103928398 A | 7/2014 |

(Continued)

OTHER PUBLICATIONS

Office Action for corresponding Chinese Application 201710301304.5 dated Apr. 6, 2019.
(Continued)

*Primary Examiner* — Daniel P Shook
(74) *Attorney, Agent, or Firm* — Arent Fox LLP; Michael Fainberg

(57) ABSTRACT

The disclosure provides a flexible display panel, a method for fabricating the same, and a flexible display device. A flexible display panel according to an embodiment of the disclosure includes at least one bendable area; a neutral layer adjusting structure arranged in the at least one bendable area, and configured to adjust the position of a neutral layer in the bendable area where the neutral layer adjusting structure is located; and a flexible element located in the bendable area, and configured to be approximately located at the neutral layer.

14 Claims, 4 Drawing Sheets

(51) Int. Cl.
    *H01L 27/12*     (2006.01)
    *G09F 9/30*     (2006.01)

(56) References Cited

U.S. PATENT DOCUMENTS

| | | |
|---|---|---|
| 2015/0255522 A1 | 9/2015 | Sato et al. |
| 2016/0218305 A1* | 7/2016 | Kim ................ G02F 1/133305 |
| 2018/0010886 A1 | 4/2018 | Wang |

FOREIGN PATENT DOCUMENTS

| | | |
|---|---|---|
| CN | 104103669 A | 10/2014 |
| CN | 105679800 A | 6/2016 |
| CN | 105826350 A | 8/2016 |
| CN | 105870355 A | 8/2016 |
| CN | 107068695 A | 8/2017 |

OTHER PUBLICATIONS

ISR for corresponding application PCT/CN2018/074145 dated May 3, 2018.

* cited by examiner

FLEXIBLE DISPLAY PANEL, METHOD FOR FABRICATING THE SAME, AND FLEXIBLE DISPLAY DEVICE This application is a National Stage of International Application No. PCT/CN2018/074145, filed Jan. 25, 2018, which claims the benefit of Chinese Patent Application No. 201710301304.5, filed with the Chinese Patent Office on May 2, 2017, and entitled "A flexible display panel, a method for fabricating the same, and a flexible display device", both of which are hereby incorporated by reference in their entireties.

FIELD

The present disclosure relates to the field of display technologies, and particularly to a flexible display panel, a method for fabricating the same, and a flexible display device.

BACKGROUND

Flexible display panels have become a research focus in the field of display technologies in recent years, and will bring a profound influence on applications of a wearable device due to a low weight, a small thickness, bendability, and other characteristics thereof, and the flexible display panels will be widely applied in future as personal intelligent terminals are pervading constantly.

SUMMARY

An embodiment of the disclosure provides a flexible display panel including:
at least one bendable area;
a neutral layer adjusting structure arranged in the at least one bendable area, and configured to adjust a position of a neutral layer in the bendable area where the neutral layer adjusting structure is located; and
a flexible element located in the bendable area, and configured to be approximately located at the neutral layer.

Optionally, the bendable area includes a substrate on which the flexible display element is arranged, and the neutral layer adjusting structure is configured to be located on a side of the substrate away from the flexible element.

Optionally, the bendable area includes a substrate on which the flexible display element is arranged, and the neutral layer adjusting structure is configured to be located on a side of the flexible element away from the substrate.

Optionally, the neutral layer adjusting structure includes at least two delimiting strips arranged at an interval on a outermost side of the bendable area where the neutral layer adjusting structure is located, an extension direction of each of the delimiting strips is parallel to a direction of a bending axis of the bendable area, and heights of the delimiting strips in a direction perpendicular to the flexible display panel are same.

Optionally, the neutral layer adjusting structure includes a delimiting block with a preset thickness arranged on the bendable area where the neutral layer adjusting structure is located.

Optionally, the neutral layer adjusting structure includes at least two delimiting strips arranged at an interval on a outermost side of the bendable area where the neutral layer adjusting structure is located, and a delimiting block with a preset thickness arranged on the bendable area where the neutral layer adjusting structure is located; and an extension direction of each of the delimiting strips is parallel to a direction of a bending axis of the bendable area, and heights of the delimiting strips in a direction perpendicular to the flexible display panel are same.

Optionally, the respective delimiting strips are arranged symmetric about a symmetry axis running through a bending center of the bendable area where the delimiting strips are located.

Optionally, a spacing between the respective delimiting strips is increasing gradually from the bending center of the bendable area where the delimiting strips are located to two both sides of the bendable area.

Optionally, the flexible display panel further includes a protection film located on a outermost side of the flexible display panel, and the delimiting strips are arranged in the protection film.

Optionally, the delimiting strips run through the protection layer in a thickness direction of the protection layer.

Optionally, the flexible element is a flexible circuit.

An embodiment of the disclosure further provides a flexible display device including the flexible display panel according to any one of the embodiments above of the disclosure.

An embodiment of the disclosure further provides a method for fabricating a flexible display panel, the method including:
forming a flexible element on a substrate;
forming a protection film on a side of the substrate away from the flexible element; and
forming at least two delimiting strips arranged at an interval on a part of the protection film corresponding to a bendable area, wherein an extension direction of each of the delimiting strips is parallel to a direction of a bending axis of the bendable area where a neutral layer adjusting structure is located, and heights of the delimiting strips in a direction perpendicular to the flexible display panel are same.

An embodiment of the disclosure further provides a method for fabricating a flexible display panel, the method including:
forming a flexible element on a substrate;
forming a protection film on the side of the flexible element away from the substrate; and
forming at least two delimiting strips arranged at an interval on a part of the protection film corresponding to a bendable area, wherein an extension direction of each of the delimiting strips is parallel to a direction of a bending axis of the bendable area where a neutral layer adjusting structure is located, and heights of the delimiting strips in a direction perpendicular to the flexible display panel are same.

DETAILED DESCRIPTION OF THE EMBODIMENTS

Figure 1:
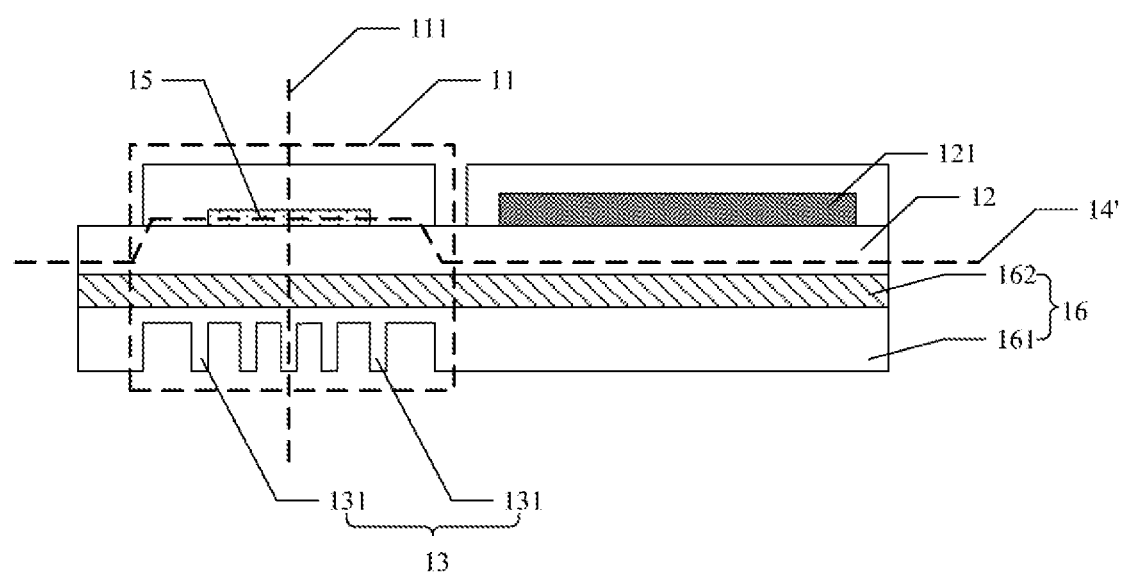
FIG. 1 is a first schematic structural diagram of a flexible display panel according to an embodiment of the disclosure.

At present, a flexible display panel is generally bent as follows: a display area or a non-display area (e.g., a circuit binding area) thereof is bent; and when the flexible display panel is bent, some element in the bendable area tends to be damaged, e.g., a circuit component in the circuit binding area in the non-display area of the flexible display panel, a display element in the display area, etc., thus degrading the product quality of the flexible display panel.

The embodiments of the disclosure provide a flexible display panel, a method for fabricating the same, and a flexible display device so as to alleviate an element in a bendable area from being damaged when the flexible display panel is bent.

The technical solutions according to the embodiments of the disclosure will be described below clearly and fully with reference to the drawings in the embodiments of the disclosure, and apparently the embodiments to be described are only a part but not all of the embodiments of the disclosure. Based upon the embodiments here of the disclosure, all the other embodiments which can occur to those ordinarily skilled in the art without any inventive effort shall fall into the claimed scope of the disclosure.

It shall be noted that the thicknesses and shapes of respective layers in the drawings are only intended to illustrate the disclosure of the disclosure.

An embodiment of the disclosure provides a flexible display panel as illustrated in FIG. 1 including followings.

At least one bendable area 11, a neutral layer adjusting structure 13 arranged in the at least one bendable area 11, and configured to adjust the position of a neutral layer 14' in the bendable area 11 where the neutral layer adjusting structure is located; and a flexible element 15 located in the bendable area 11, and configured to be approximately located at the neutral layer 14'.

Figures 7, 8:
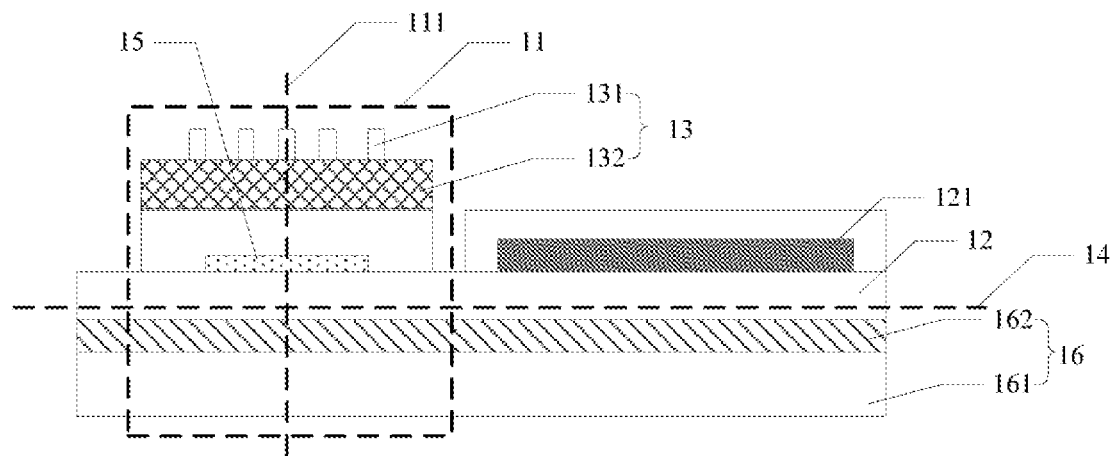
FIG. 7 is a sixth schematic structural diagram of the flexible display panel according to the embodiment of the disclosure.
FIG. 8 is a schematic structural diagram of a neutral layer made of a bendable material.

Here the concept of the neutral layer is as illustrated in FIG. 8 illustrating a bendable material including an outer surface 01, an inner surface 02, and a neutral layer 03, where the bendable material is bendable along a bending axis 04 lying in the direction perpendicular to the paper; and a component inside the neutral layer 03 is subjected to a compressive stress, and a component outside the neutral layer 03 is subjected to a tensile stress, with respect to the bending axis 04. Accordingly the neutral layer 03 refers to a surface formed of all the positions with a zero stress when the material is bent and deformed, and the curvature radius of the neutral layer 03 is defined in Equation (1) below:

$$\rho = \eta\left(\frac{R+r}{2}\right) = \eta\left(\frac{2r+h}{2}\right) \quad (1)$$

Where $\rho$ represents the curvature radius of the neutral layer 03; $\eta$ represents a thinning coefficient, i.e., the ratio of the bent thickness to the original thickness; R represents the curvature radius of the outer surface 01; r represents the curvature radius of the inner surface 02; and h represents the thickness of the material (i.e., the distance between the inner surface 02 and the outer surface 03).

The position of the neutral layer 03 in the material can be changed locally as the thickness h of the material is changed locally.

Optionally, as illustrated in FIG. 1, in the flexible display panel above according to the embodiment of the disclosure, the position of the neutral layer in the bendable area 11 where the neutral layer adjusting structure 13 is located can be adjusted using the neutral layer adjusting structure 13, so that a flexible element 15 in the bendable area 11 are approximately located at the neutral layer 14', and thus will not be easily damaged, thus alleviating the element in the bendable area from being damaged when the flexible display panel is bent. Optionally, under a real condition, after the position of the neutral layer is adjusted using the neutral layer adjusting structure 13, the flexible element 15 may not be exactly located at the neutral layer 14' due to an error, but may be located around the neutral layer 14', that is, the flexible element 15 may be approximately located at the neutral layer 14'. For example, the flexible element 15 may be located within an offset of ±10% and optionally ±5% from the neutral layer 14', that is, the flexible element 15 is approximately located at the neutral layer 14', and at this time, the flexible element 15 will not be easily damaged either. Furthermore there may be different layers in different areas on the flexible display panel, the neutral layer 14' may not be a plane, but will be illustrated as a layer consisted of several planes for the sake of convenient understanding.

It shall be noted that for the same flexible display panel, the bendable area 11 above typically shall be fixed, that is, in the technical solution according to the embodiment of the disclosure, the position of the neutral layer in the corresponding bendable area 11 can be adjusted using the neutral layer adjusting structure 13 without changing the distribution of the bendable area 11 on the flexible display panel.

Optionally, the flexible display panel above according to the embodiment of the disclosure can be a flexible LCD display panel, a flexible OLED display panel, a flexible electrophoretic display panel, etc. The flexible display panel as referred to here may be a display panel including a flexible display area, or a display panel including a flexible non-display area, or a display panel including both a flexible display area and a flexible non-display area, although the embodiment of the disclosure will not be limited thereto.

Optionally, in the flexible display panel above according to the embodiment of the disclosure, referring to FIG. 1, for example, a general structure of the flexible display panel can include a substrate 12, flexible display elements 121 located in a display area on the substrate 12, and/or a flexible circuit located in a non-display area, where an external circuit board is connected with the flexible display elements 121 through the flexible circuit. Furthermore a circuit binding area in the non-display area can include an adhesive material for binding and adhering, a chip to be bound, a bound component protecting adhesive-material, and other components in addition to the flexible circuit.

Optionally, in the flexible display panel above according to the embodiment of the disclosure, referring to FIG. 1, the flexible element 15 can be a flexible circuit in the circuit binding area in the non-display area, for example, but of course, the flexible element 15 can alternatively be flexible display elements 121 in the display area, etc., although the embodiment of the disclosure will not be limited thereto. The flexibility of the flexible element 15 may be lower than that of the other components, e.g., the substrate 12, so they may be easily damaged while the flexible display panel is being bent.

The flexible element 15 which is flexible circuits will be described throughout FIG. 1 to FIG. 7. Although only one bendable area 11 is illustrated in FIG. 1 to FIG. 7, and the bendable area 11 is located in the circuit binding area, the technical solution according to the embodiment of the disclosure will not be limited thereto, and for example, the bendable area 11 may alternatively be located in the display area, and the number of bendable areas 11 may be plural, as needed in reality. Furthermore the bendable area 11 may alternatively be the entire flexible display panel, although the embodiment of the disclosure will not be limited thereto.

Optionally, in the flexible display panel above according to the embodiment of the disclosure, as illustrated in FIG. 1 to FIG. 7, the bendable area 11 includes a substrate 12 on which the flexible element 15 are arranged. FIG. 1 illustrates the position of the neutral layer 14' adjusted using the neutral layer adjusting structure 13, and FIG. 2 to FIG. 7 illustrate the position of the neutral layer 14 which is not adjusted.

Figure 2:
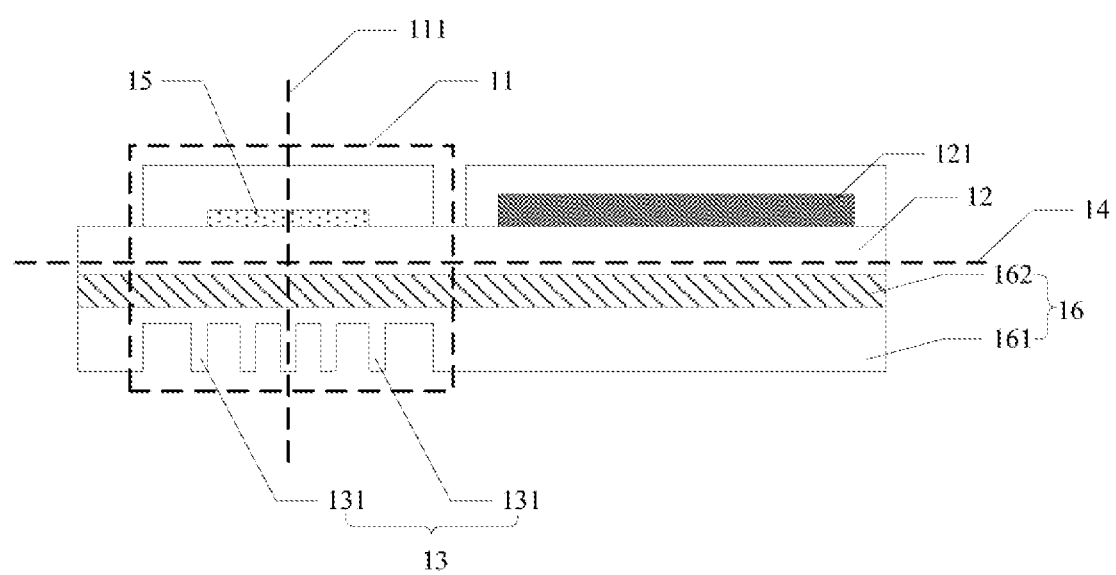
FIG. 2 is a second schematic structural diagram of the flexible display panel according to the embodiment of the disclosure.
Figure 3:
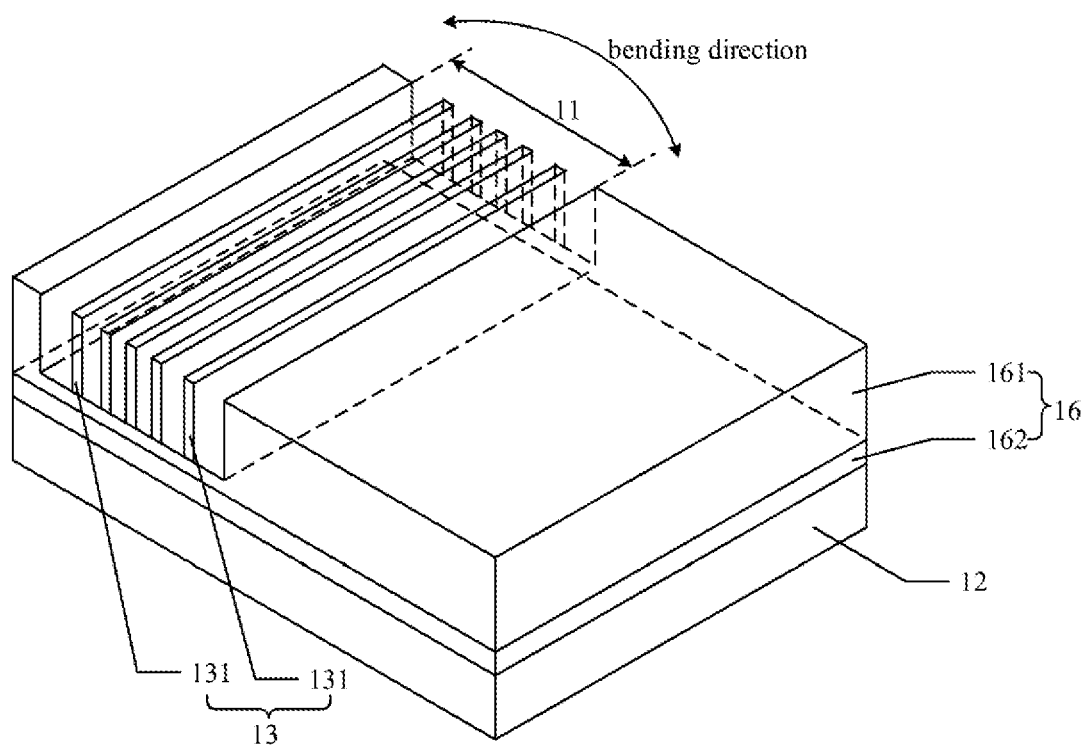
FIG. 3 is a bottom view of the flexible display panel according to the embodiment of the disclosure.
Figure 4:
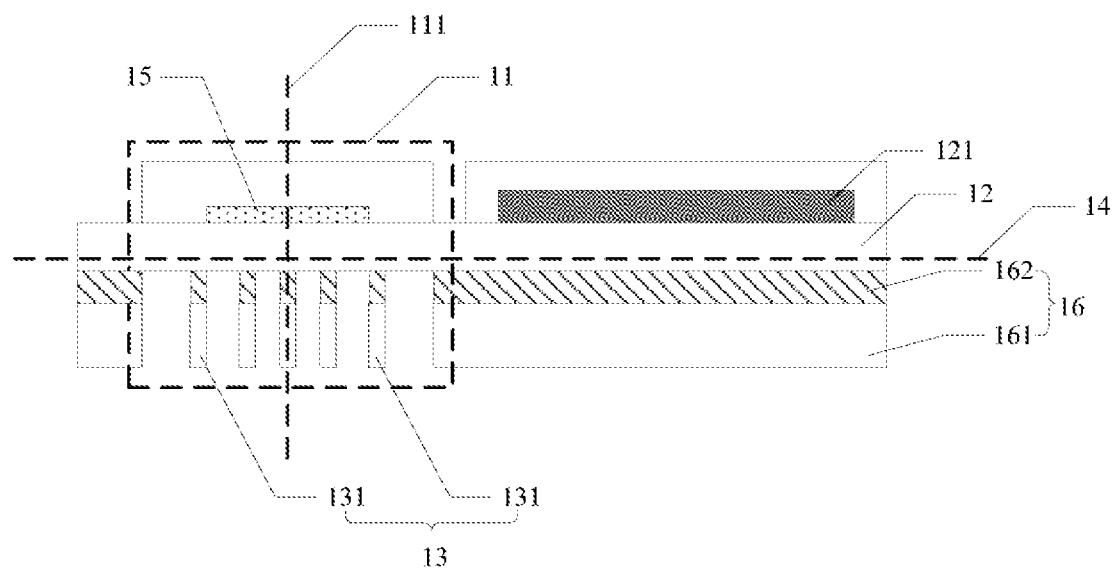
FIG. 4 is a third schematic structural diagram of the flexible display panel according to the embodiment of the disclosure.
Figure 5:
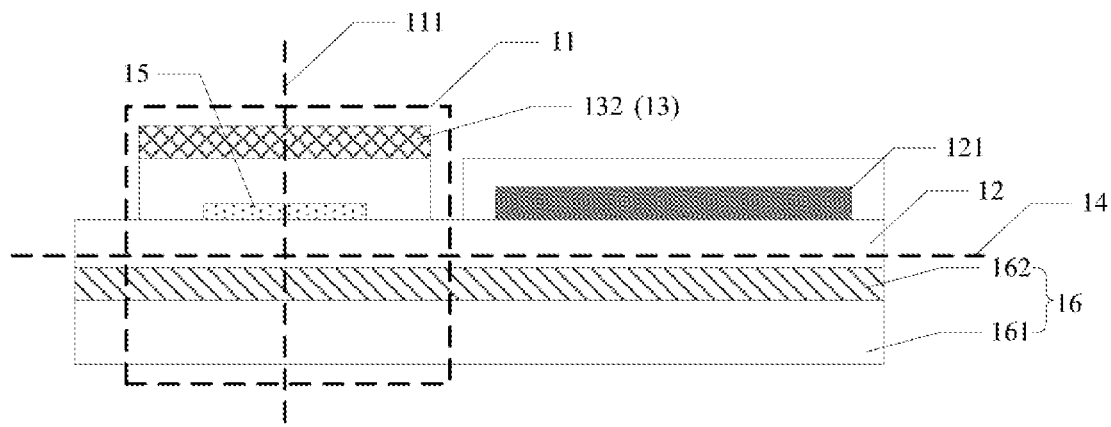
FIG. 5 is a fourth schematic structural diagram of the flexible display panel according to the embodiment of the disclosure.
Figure 6:
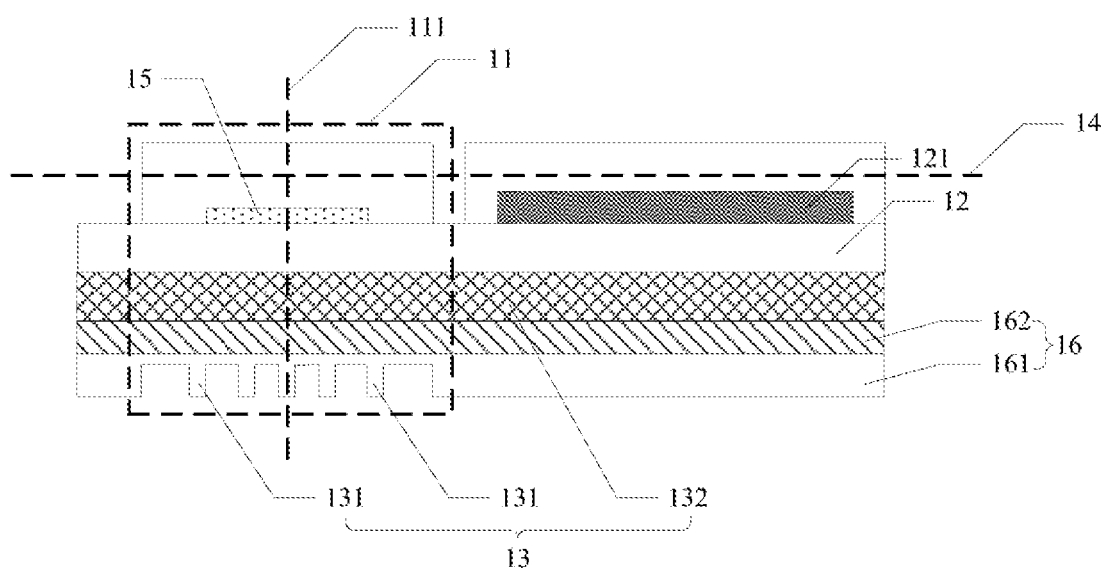
FIG. 6 is a fifth schematic structural diagram of the flexible display panel according to the embodiment of the disclosure.

Optionally, as illustrated in FIG. 2 to FIG. 4, the neutral layer adjusting structure 13 can be located on the same side, of the flexible element 15 in the bendable area 11 where the neutral layer adjusting structure is located, as the neutral layer 14 which is not adjusted. As illustrated in FIG. 2, for example, the neutral layer adjusting structure 13, and the neutral layer 14 which is not adjusted can be located on the side of the flexible element 15 facing the substrate 12 of the flexible display panel, and at this time, the neutral layer adjusting structure 13 can be configured to be located on the side of the substrate 12 away from the flexible element 15. Optionally, as illustrated in FIG. 5 to FIG. 7, the neutral layer adjusting structure 13, and the neutral layer 14 which is not adjusted can alternatively be located on different sides of the flexible element 15 in the bendable area 11 where the neutral layer adjusting structure is located. As illustrated in FIG. 6, for example, the neutral layer 14 which is not adjusted can be located on the side of the flexible element 15 away from the substrate 12 of the flexible display panel, and at this time, the neutral layer adjusting structure 13 can be configured to be located on the side of the substrate 12 away from the flexible element 15; and as illustrated in FIG. 5 and FIG. 7, for example, the neutral layer 14 which is not adjusted can be located on the side of the flexible element 15 facing the substrate 12 of the flexible display panel, and at this time, the neutral layer adjusting structure 13 can be configured to be located on the side of the flexible element 15 away from the substrate 12.

Optionally, in the flexible display panel above according to the embodiment of the disclosure, no matter whether the neutral layer adjusting structure 13 is located on the side of the flexible element 15 away from the substrate 12, or on the side of the substrate 12 away from the flexible element 15, as illustrated in FIG. 2 to FIG. 4, the neutral layer adjusting structure 13 can include at least two delimiting strips 131 arranged at an interval on the outermost side of the bendable area 11 where the neutral layer adjusting structure is located, where extension directions of the respective delimiting strips 131 are parallel to the direction of a bending axis of the bendable area 11, and the heights of the respective delimiting strips 131 in the direction perpendicular to the flexible display panel are the same.

Optionally, the delimiting strips 131 are arranged so that the thickness of the bendable area 11 on the neutral layer adjusting structure 13 side is reduced to thereby enable the adjusted neutral layer 14 to move to the flexible element 15. Furthermore the delimiting strips 131 are arranged at an interval to reduce the thickness of the bendable area 11 so that the flexible display panel can be bent in the bendable area 11.

Optionally, in the flexible display panel above according to the embodiment of the disclosure, no matter whether the neutral layer adjusting structure 13 is located on the side of the flexible element 15 away from the substrate 12, or on the side of the substrate 12 away from the flexible element 15, as illustrated in FIG. 5, the neutral layer adjusting structure 13 can include a delimiting block 132 with a preset thickness arranged on the bendable area 11 where the neutral layer adjusting structure is located.

Optionally, the delimiting block 132 is arranged so that the thickness of the bendable area 11 on the neutral layer adjusting structure 13 side is increased to thereby enable the adjusted neutral layer 14 to move to the flexible element 15. Furthermore when the delimiting block 132 is arranged to thereby increase the thickness of the bendable area 11, the delimiting block 132 with a preset thickness in the bendable area 11 where the delimiting block is located is such a delimiting block 132 that covers at least a part or all of the bendable area 11, that is, the delimiting block 132 either in a part of or throughout the bendable area 11 can achieve the effect of increasing the thickness of the bendable area 11.

Optionally, the thickness of the delimiting block 132 is related to the distance between the neutral layer 14, which is not adjusted, in the bendable area 11 where the delimiting block is located, and the flexible element 15, so the preset thickness of the delimiting block 132 above can be set as needed in reality.

Optionally, in the flexible display panel above according to the embodiment of the disclosure, no matter whether the neutral layer adjusting structure 13 is located on the side of the flexible element 15 away from the substrate 12, or on the side of the substrate 12 away from the flexible element 15, as illustrated in FIG. 6 and FIG. 7, the neutral layer adjusting structure 13 can include at least two delimiting strips 131 arranged at an interval on the outermost side of the bendable area 11 where the neutral layer adjusting structure is located, and a delimiting block 132 with a preset thickness arranged on the bendable area 11 where the neutral layer adjusting structure is located, where the extension directions of the respective delimiting strips 131 are parallel to the direction of a bending axis of the bendable area 11, and the heights of the respective delimiting strips 131 in the direction perpendicular to the flexible display panel are the same.

As illustrated in FIG. 6, if the neutral layer 14 which is not adjusted is located on the side of the flexible element 15 away from the substrate 12 of the flexible display panel, then the neutral layer adjusting structure 13 will be located on the side of the substrate 12 away from the flexible element 15, the delimiting strips 131 will be located on the outermost side of the flexible display panel, and on the side of the substrate 12 away from the flexible element 15, and the delimiting block 132 will be located between the substrate 12 and the delimiting strips 131.

As illustrated in FIG. 7, if the neutral layer 14 which is not adjusted is located on the side of the flexible element 15 facing the substrate 12 of the flexible display panel, then the neutral layer adjusting structure 13 will be located on the side of the flexible element 15 away from the substrate 12, the delimiting strips 131 will be located on the outermost side of the flexible display panel, and on the side of the flexible element 15 away from the substrate 12, and the delimiting block 132 will be located between the flexible element 15 and the delimiting strips 131.

Optionally, the delimiting block 132 can be arranged so that the adjusted neutral layer 14 is positioned on the same side, of the flexible element 15 in the bendable area 11 where the delimiting block is located, as that of the delimiting block, and then the delimiting strips 131 can be arranged so that the flexible element 15 in the bendable area 11 is located at the neutral layer 14. Furthermore the delimiting strips 131 can be arranged on the outermost side to thereby enable the flexible display panel to be bent.

It shall be noted that in order not to affect a display effect, when the bendable area 11 is located in the display area, typically the position of the neutral layer 14 is typically adjusted using the neutral layer adjusting structure 13 including the delimiting strips 131 located on another side than a display face.

Optionally, in the flexible display panel above according to the embodiment of the disclosure, the respective delimiting strips 131 can be arranged at an uniform interval, or can be arranged at a non-uniform interval, although the embodiment of the disclosure will not be limited thereto.

Optionally, in the flexible display panel above according to the embodiment of the disclosure, the heights of the delimiting strips 131 are related to the distance between the neutral layer 14, which is not adjusted, in the bendable area, and the flexible element 15, so the preset heights of the delimiting strips 131 can be set as needed in reality.

It shall be noted that if there are a larger number of delimiting strips 131 in the bendable area 11 where the delimiting strips are located, that is, the delimiting strips 131 are distributed at a higher density, then they will be less bendable, that is, they will have a larger bending curvature; and if there are a smaller number of delimiting strips 131 in the bendable area 11 where the delimiting strips are located, that is, the delimiting strips 131 are distributed at a lower density, then they will be more bendable, that is, they will have a smaller bending curvature, so the number of delimiting strips 131 can be set according to a desirable bending radius.

Optionally, in the flexible display panel above according to the embodiment of the disclosure, as illustrated in FIG. 2 to FIG. 7, in order to enable the flexible display panel to be bent, the respective delimiting strips 131 can be arranged symmetric about a symmetry axis running through the bending center 111 of the bendable area 11 where the delimiting strips are located, and distributed in an array in the bending direction of the bendable area 11 where the delimiting strips are located.

Optionally, in the flexible display panel above according to the embodiment of the disclosure, as illustrated in FIG. 2 to FIG. 7, the spacing between the respective delimiting strips 131 may be increasing gradually from the bending direction of the bendable area 11 where the delimiting strips are located, and the spacing between the different delimiting strips 131 can accommodate different extents of bending, so that the flexible display panel can be bent for adjusting while it is being subsequently assembled.

Optionally, in the flexible display panel above according to the embodiment of the disclosure, the sidewalls of the delimiting strips 131 can be planar or arced surfaces. The arced surfaces may be convex or concave, and the sidewalls of the delimiting strips 131 can be perpendicular to the substrate of the flexible display panel, or can be arranged at an angle from the substrate of the flexible display panel, although the embodiment of the disclosure will not be limited thereto.

Optionally, in the flexible display panel above according to the embodiment of the disclosure, as illustrated in FIG. 2 to FIG. 4 and FIG. 6, the flexible display panel can further include a protection film 16 located on the outermost side of the flexible display panel, and the delimiting strips 131 can be arranged in the protection film 16. FIG. 2 to FIG. 7 illustrate the protection layer 16 arranged on the backside of the flexible display panel, i.e., another side thereof than the display face, but the protection layer 16 can alternatively be located on the display face in reality, although the embodiment of the disclosure will not be limited thereto.

Optionally, in the flexible display panel above according to the embodiment of the disclosure, as illustrated in FIG. 2 to FIG. 7, the protection layer 16 can include a back-film substrate 161 and a back-film adhesive layer 162, where the material of the back-film substrate 161 can be polyimide (PI), a metal foil, triacetate cellulose (TAC), polycarbonate (PC), Polyethylene naphthalate two formic acid glycol ester (PEN), Polyethylene terephthalate two formic acid glycol ester (PET), etc.

Optionally, since the protection film 16 is arranged at the same layer as the delimiting layers 131, they can be fabricated in a process to thereby simplify the process.

Optionally, in the flexible display panel above according to the embodiment of the disclosure, as illustrated in FIG. 4, the delimiting strips 131 can run through the protection layer 16 in the thickness direction thereof, that is, the delimiting strips 131 run through the back-film substrate 161 and the back-film adhesive layer 162 in the thickness direction of the protection layer 16. Of course, the heights of the delimiting strips 131 can alternatively be less than the thickness of the protection film 16, and as illustrated in FIG. 2, FIG. 3, and FIG. 6, for example, the heights of the delimiting strips 131 can alternatively be less than or equal to the thickness of the back-film substrate 161, that is, the back-film adhesive layer 162 is not run through by the delimiting strips 131. The thicknesses of the delimiting strips 131 can be optionally determined by the distance between the neutral layer 14 and the flexible element 15 to be adjusted as needed in reality.

In an embodiment of the disclosure, the flexible display panel which is a top-emitting flexible display panel includes two bendable areas 11 including one located in the circuit binding area, and the other located in the display area, in both of which, the neutral layer 14 which is not adjusted is located on the located on the sides of the respective flexible elements 15 facing the substrate 12 of the flexible display panel; and the protection film 16 is arranged on the backside of the flexible display panel, and located on the outermost side of the flexible display panel, and at this time, the respective delimiting strips 131 can be arranged in the protection film 16 at positions corresponding to these two bendable areas 11, and the thicknesses of the delimiting strips 131 are set according to distance between the neutral layer 14 and the flexible elements 15 to be adjusted as needed in reality.

Based upon the inventive idea above, those skilled in the art can appreciate that when there are a plurality of bendable areas 11, the arrangement of the neutral layer adjusting structure 13 in the respective bendable areas 11 can be adjusted as needed for the performance of the different bendable areas 11, and the flexibilities of the elements therein. When a bendable area 11 involves a plurality of flexible elements, or runs across the display area and the non-display area of the flexible display panel, the spacing between the delimiting strips 131, and their heights can be finely adjusted for the different flexible elements or areas as needed.

Based upon the inventive idea above, those skilled in the art can appreciate that since the delimiting block 132 and the delimiting strips 131 play different roles in the neutral layer adjusting structure 13, they generally operate as illustrated in FIG. 6 or FIG. 7. Since cutting into the delimiting strips 131 is process-restrained, if it is necessary to perform a fine adjustment which cannot be achieved by adjusting the delimiting strips 131 separately, then the delimiting block 132 and the delimiting strips 131 may be arranged on the same side of the flexible element 15 for adjusting.

Based upon the same inventive idea, an embodiment of the disclosure further provides a method for fabricating a flexible display panel, where the method includes the following steps.

The step of forming a flexible element on a substrate.

The step of forming a protection film on the side of the substrate away from the flexible element.

The step of forming at least two delimiting strips arranged at an interval on the part of the protection film corresponding to a bendable area, where the extension directions of the respective delimiting strips are parallel to the direction of a bending axis of the bendable area where a neutral layer adjusting structure is located, and the heights of the respective delimiting strips in the direction perpendicular to the flexible display panel are the same.

Optionally, at least two delimiting strips are formed at an interval in the part of the protection film corresponding to the bendable area, and the delimiting strips can be formed through laser cutting, die cutting, knife-wheel cutting, etching, or in another process.

Based upon the same inventive idea, an embodiment of the disclosure further provides another method for fabricating a flexible display panel, where the method includes the following steps.

The step of forming a flexible element on a substrate.

The step of forming a protection film on the side of the flexible element away from the substrate.

The step of forming at least two delimiting strips arranged at an interval on the part of the protection film corresponding to a bendable area, where the extension directions of the respective delimiting strips are parallel to the direction of a bending axis of the bendable area where a neutral layer adjusting structure is located, and the heights of the respective delimiting strips in the direction perpendicular to the flexible display panel are the same.

Optionally, at least two delimiting strips are formed at an interval in the part of the protection film corresponding to the bendable area, and the delimiting strips can be formed through laser cutting, die cutting, knife-wheel cutting, etching, or in another process.

Based upon the same inventive idea, an embodiment of the disclosure further provides a flexible display device including the flexible display panel according to any one of the embodiments above of the disclosure. For example, the flexible display device can be a flexible LCD display, a flexible OLED display, a flexible electrophoretic display, although the embodiment of the disclosure will not be limited thereto.

In summary, in the technical solutions according to the embodiments of the disclosure, the flexible display panel includes at least one bendable area, a neutral layer adjusting structure arranged in the at least one bendable area, and configured to adjust the position of a neutral layer in the bendable area where the neutral layer adjusting structure is located; and a flexible element located in the bendable area, and configured to be approximately located at the neutral layer. Since the neutral layer adjusting structure is arranged on the flexible display panel at the position corresponding to the at least one bendable area of the flexible display panel, the position of the neutral layer in the bendable area where the neutral layer adjusting structure is located can be adjusted using the neutral layer adjusting structure, so that the flexible element in the bendable area can be approximately located at the neutral layer, and thus will not be easily damaged, thus alleviating the flexible element in the bendable area from being damaged when the flexible display panel is bent.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A flexible display panel, comprising:
   at least one bendable area;
   a neutral layer adjusting structure arranged in the at least one bendable area, and configured to adjust a position of a neutral layer in the bendable area where the neutral layer adjusting structure is located; and
   a flexible element located in the bendable area, and configured to be approximately located at the neutral layer.

2. The flexible display panel according to claim 1, wherein the bendable area comprises a substrate on which the flexible display element is arranged, and the neutral layer adjusting structure is configured to be located on a side of the substrate away from the flexible element.

3. The flexible display panel according to claim 2, wherein the neutral layer adjusting structure comprises at least two delimiting strips arranged at an interval on a outermost side of the bendable area where the neutral layer adjusting structure is located, an extension direction of each of the delimiting strips is parallel to a direction of a bending axis of the bendable area, and heights of the respective delimiting strips in a direction perpendicular to the flexible display panel is same.

4. The flexible display panel according to claim 3, wherein the delimiting strips are arranged symmetric about a symmetry axis running through a bending center of the bendable area where the delimiting strips are located.

5. The flexible display panel according to claim 4, wherein a spacing between each of the delimiting strips is increasing gradually from the bending center of the bendable area where the delimiting strips are located to both sides of the bendable area.

6. The flexible display panel according to claim 3, further comprises a protection film located on a outermost side of the flexible display panel, and the delimiting strips are arranged in the protection film.

7. The flexible display panel according to claim 6, wherein the delimiting strips run through the protection layer in a thickness direction of the protection layer.

8. The flexible display panel according to claim 2, wherein the neutral layer adjusting structure comprises a delimiting block with a preset thickness arranged on the bendable area where the neutral layer adjusting structure is located.

9. The flexible display panel according to claim 2, wherein the neutral layer adjusting structure comprises at least two delimiting strips arranged at an interval on a outermost side of the bendable area where the neutral layer adjusting structure is located, and a delimiting block with a preset thickness arranged on the bendable area where the neutral layer adjusting structure is located; and an extension direction of each of the delimiting strips is parallel to a direction of a bending axis of the bendable area, and heights of the delimiting strips in a direction perpendicular to the flexible display panel are same.

10. The flexible display panel according to claim 1, wherein the bendable area comprises a substrate on which the flexible display element is arranged, and the neutral layer adjusting structure is configured to be located on the side of the flexible element away from the substrate.

11. The flexible display panel according to claim 1, wherein the flexible element is a flexible circuit.

12. A flexible display device, comprising the flexible display panel according to claim 1.

13. A method for fabricating a flexible display panel, the method comprising:
  forming a flexible element on a substrate;
  forming a protection film on a side of the substrate away from the flexible element; and
  forming at least two delimiting strips arranged at an interval on a part of the protection film corresponding to a bendable area, wherein an extension direction of each of the delimiting strips is parallel to a direction of a bending axis of the bendable area where a neutral layer adjusting structure is located, and heights of the delimiting strips in a direction perpendicular to the flexible display panel are same.

14. A method for fabricating a flexible display panel, the method comprising:
  forming a flexible element on a substrate;
  forming a protection film on a side of the flexible element away from the substrate; and
forming at least two delimiting strips arranged at an interval on a part of the protection film corresponding to a bendable area, wherein an extension direction of each of the delimiting strips is parallel to a direction of a bending axis of the bendable area where a neutral layer adjusting structure is located, and heights of the delimiting strips in a direction perpendicular to the flexible display panel are same.

\* \* \* \* \*